Figure 1:
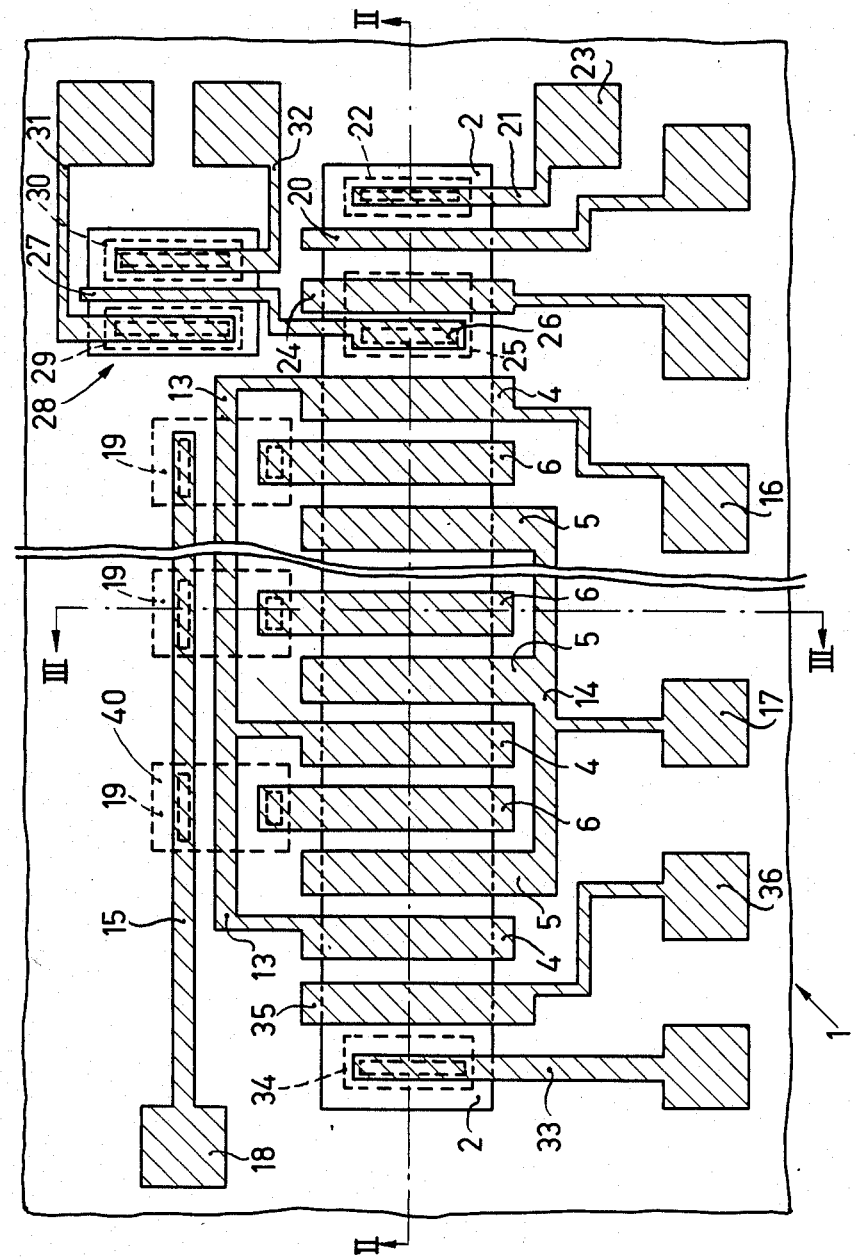

United States Patent [19]

Esser et al.

[11] Patent Number: 4,807,005
[45] Date of Patent: Feb. 21, 1989

[54] SEMICONDUCTOR DEVICE

[75] Inventors: Leonard J. M. Esser; Gijsbert Lock, both of Emmasingel, Netherlands

[73] Assignee: U.S. Philips Corporation, New York, N.Y.

[21] Appl. No.: 254,672

[22] Filed: Apr. 16, 1981

Related U.S. Application Data

[63] Continuation of Ser. No. 866,004, Dec. 30, 1977, abandoned, which is a continuation of Ser. No. 504,372, Sep. 9, 1974, abandoned, which is a continuation of Ser. No. 299,748, Oct. 24, 1972, abandoned.

[30] Foreign Application Priority Data

Oct. 27, 1971 [NL] Netherlands ................ 7114770

[51] Int. Cl.⁴ ............... H01L 29/078; H01L 27/04
[52] U.S. Cl. ........................................... 357/24
[58] Field of Search ................................. 357/24

[56] References Cited

U.S. PATENT DOCUMENTS 3,544,858 12/1970 Kooi ........................................... 357/50
3,739,240  6/1973 Krambeck ................................ 357/24
3,792,322  2/1974 Boyle et al. .............................. 357/24
3,796,927  3/1974 Boyle et al. .............................. 357/24
3,796,932  3/1974 Amelio et al. ........................... 357/24
3,902,187  8/1975 Engeler et al. ...................... 357/24 M

OTHER PUBLICATIONS

Kosonocky, IEEE ISSCC, Dig of Tech Papers, Feb. 1971, pp. 162–163.

Primary Examiner—William D. Larkins
Attorney, Agent, or Firm—Paul R. Miller

[57] ABSTRACT

The present invention involves a semiconductor device, such as a shift register, wherein information in the form of charge carriers is moved laterally through the bulk of a semiconductor layer by means of an electric field, while the charge carriers are stored at the surface of the semiconductor layer. According to this invention, information containing regions can be separated from each other by depletion zones extending through the thickness and the width of the semiconductor layer. Charge transport laterally through the interior of the semiconductor layer results in a considerable reduction of the transport time. Majority charge carriers are advantageously used.

15 Claims, 9 Drawing Sheets

SEMICONDUCTOR DEVICE

This is a continuation of application Ser. No. 866,004, filed Dec. 30, 1977, which is a continuation of Ser. No. 504,372, filed Sept. 9, 1974, which is a continuation of Ser. No. 299,748, filed Oct. 24, 1972, all abandoned.

The invention relates to a semiconductor device, in particular a shift register comprising a semiconductor body having a semiconductor layer of one conductivity type, means for locally introducing into the semiconductor layer information in the form of electric charge, and means for reading the charge elsewhere on the layer, on which semiconductor layer members are present on at least one side of the layer for applying clock voltages by which the charge is transported through the semiconductor layer in a direction parallel to the layer.

Clock voltages are to be understood to mean herein alternating voltages which move in the semiconductor layer parallel to the direction of charge transport. Clock voltages usually are voltage pulses the slope (dV/dt) of which, however, can vary within wide limits. The members usually consist of electrodes which are separated from the semiconductor layer by a barrier layer and are connected to clock voltage sources. However, the members may also comprise a piezo-electric layer in which an acoustic wave can be propagated which is converted into the clock voltage by the piezo-electric material.

Such devices which are used, for example, in delay lines for audio or video frequency signals are known, for example, from Electronics of May 11, 1970, p. 112 et seq. and are in general based on the principle that a signal in the form of electric charge is supplied to the device, for example a shift register, and is transported to an output via a series of successive stages, the charge being each time stored in one of the stages for a certain period of time.

For a good operation of the shift register it is first of all desirable that the transport efficiency be as high as possible, that is to say that the quantity of information-forming charge which is lost in each transition from one stage to a subsequent stage, for example, as a result of recombination of charge carriers or as a result of charge remaining in the first stage, is minimized.

A further important quantity is formed by the transport time, that is to say the time which is necessary to move the electric charge from one stage to a subsequent stage. The transport time which, as will become apparent hereinafter, is inter alia decisive of the number of signals which can be supplied to the shift register per unit time and hence of the frequency maximally to be handled by the shift register, is preferably as small as possible.

The operation of the above-described known device is furthermore based on the principle that depletion zones in which information-forming charge in the form of minority charge carriers can be stored and moved and which adjoin the surface can be created in the semiconductor layer.

For that purpose, for example in the case in which the semiconductor layer consists of n-type silicon, the semiconductor layer is placed at a positive bias voltage relative to the electrode so as to obtain the depletion zones and the information is supplied to the shift register in the form of holes which, as a result of the voltage between the electrodes and the semiconductor layer, will mainly be present at the interface between the semiconductor layer and the insulating layer.

In this known device, the movement of charge (in the form of holes) from one stage (deletion zone) to a subsequent stage (depletion zone) of the shift register takes place by means of a voltage source connected between the electrodes associated with the regions by means of which a potential well is created at the interface between the insulating layer and the semiconductor body at the area of the second stage.

During transport, the holes which are stored in the first stage and which are present near the second stage flow into the potential well as a result of which a concentration gradient is built up in the first stage. Under the influence of the concentration gradient and an associated drift field, a movement of charge takes place in the first stage in the direction of the second stage.

It is proved in I.E.E.E. International Solid-State Circuits Conference, 1971, pp. 158 and 159 that the movement of charge which mainly determines the transport speed can be described by a diffusion equation with an effective diffusion coefficient which is substantially proportional to the mobility of the charge carriers and is composed of a charge-independent diffusion constant and of a charge-dependent part which determines the movement of charge as a result of the drift field.

In these known devices the transport time is inter alia detrimentally influenced in that during transport the charge carriers move mainly along the surface of the semiconductor layer as a result of which their mobility is rather low, possibly as a result of surface states. In the case of silicon, for example, the mobility both of electrons and of holes at the surface is approximately 2 times as low as in the interior of the semiconductor body, as a result of which the diffusion coefficient along the surface is also two times as small as in the interior of the semiconductor layer.

Furthermore the drift field component, which is strongly dependent on the total quantity of charge, contributes to the total transport to a considerable extent only in the case of a comparatively high charge concentration, but decreases accordingly as more charge is transferred, as a result of which the transport is finally determined substantially only by diffusion.

This means inter alia that, in particular with the none too high concentrations occuring in practice, the transport time is mainly determined by the last charge residues still to be transferred which, for being transferred, may require disproportionately much time as compared with the quantity of charge already transferred.

In some cases a considerable decrease of the transport time can be obtained while sacrificing a part of the transport efficiency, the last residues of charge being not transferred.

However, this remaining of charge has the drawback that cross-talk may occur between the successive information forming charges to be transported through the shift register, as a result of which inter alia the frequency range of the signals to be supplied to the shift register is restricted. Moreover, in a great many caess, for example, in delay lines having a very large number of stages, a very high transport efficiency is required so as to prevent too large a loss of information.

One of the objects of the invention is to provide a device for transporting information-forming charge, in particular a shift register, in which the charge transport takes place according to a principle differing from the described known devices, which device can be operated under normal conditions of temperature and pressure.

Another object of the invention is to provide a semiconductor device having very small transport times in which a high transport efficiency can nevertheless be obtained.

The invention is inter alia based on the recognition of the fact that particular advantages, for example a considerable reduction of the transport time, can be obtained if the movement of charge does not take place mainly along the surface but via the interior of the semiconductor layer.

Therefore, according to the invention, a semiconductor device of the type described in the preamble is characterized in that, except for the introduction and removal of the charge, the semiconductor layer is entirely insulated electrically from the surroundings at least during operation, that the members in a direction transverse to the direction of charge transport extend at least throughout the semiconductor layer, and that the thickness and the doping concentration of the semiconductor layer are at least so small that an electric field can be applied in the semiconductor layer transversely to the layer, wherein avalanche multiplication does not occur and as a result of which a depletion zone is formed throughout the thickness of the semiconductor layer.

The members are to be understood to include herein all means to apply an electric field in the semiconductor layer. However, a preferred embodiment of a semiconductor device according to the invention is characterized in that the members are formed by electrodes which are separated from the semiconductor layer by a barrier layer. The electrodes may be formed, for example, by semiconductor zone of the conductivity type opposite to that of the semiconductor layer which constitute with the semiconductor layer a barrier layer in the form of a p-n junction. Furthermore, barrier layers in the form of rectifying metal-semiconductor junctions biased in the reverse direction, so-called Schottky junctions, may also be used in which an electrode consists of a metal layer which is suitable for the formation of a Schottky junction and which is provided directly on the surface of the semiconductor layer. The terms "electrodes" and "barrier layer" should therefore be understood to include any electrode form in which the electrode and the semiconductor layer are electrically insulated from each other.

However, the electrodes preferably consist of conductive layers, for example, metal layers, but also, for example, of highly doped semiconductor layers such as highly doped polycrystalline silicon, which are separated from the semiconductor material by a barrier layer of insulating material, for example, silicon oxide.

The semiconductor layer may be insulated from the surroundings in many known ways, for example, in that the layer is surrounded on all sides by a layer of an insulating material, or is covered at least on one side with insulating material and is bounded on the remaining sides by a semiconductor region of the conductivity type opposite to that of the semiconductor layer, via a barrier p-n junction, by a depletion zone permanently present in the operating condition, or by combination of such measures.

Since in the device according to the invention the semiconductor layer is insulated from the surroundings and, for example, does not comprise a connection conductor with the exception of possible input and output connections, as in the described known device, the external electric fields which influence the information-forming charge carriers, are determined by the clock voltages between the electrodes mutually.

Moreover, also since the semiconductor layer is insulated from the surroundings, in contrast with the described known device, the electric fields caused by the clock voltages in the semiconductor layer in the device according to the invention may be directed so that the information-forming electric charge is not attracted but repelled by the electrodes, in which the charge nevertheless remains in the semiconductor layer. This may increase the speed at which the charge carriers are transported from one stage to the subsequent stage.

Since furthermore the members for applying the clock voltages and the electrodes, respectively, extend throughout the semiconductor layer in a direction transverse to the charge transport, the information-forming charges present in the shift register may be separated from each other by electric fields in the depletion zones which extend throughout the thickness of the layer and in a direction transverse to the charge transport throughout the width of the semiconductor layer.

Therefore, information-forming charges can be transported each time from one stage to a subsequent second stage of a shift register according to the invention at least mainly via the interior of the semiconductor layer, in contrast with the already described known shift register in which the charge transport takes place along the interface of the semiconductor layer and the insulating layer.

As a result of this the transport time in a shift register according to the invention can be considerably smaller than in the described known device. Since furthermore during the charge transport from the first stage to the second stage, the distance between the information-forming charge and the electrode associated with the first stage moreover increases and can even become many times larger than the thickness of the insulating layer, the capacitive coupling during the transport strongly decreases as a result of which an extra reduction of the transport time is obtained. A semiconductor device according to the invention can furthermore be advantageously operated with clock voltages which, if desirable, show ony two voltage levels.

In a semiconductor device according to the invention the information-forming charge carriers may consist of minority charge carriers which can be supplied, for example, to the shift register after substantially all the majority charge carriers have first been removed from the semiconductor layer, for example, by a shifting depletion zone. A preferred embodiment of the semiconductor device, in particular a shift register, according to the invention, however, is characterized in that by applying a clock voltage by means of the members destined for that purpose in the semiconductor layer, depletion zones can be formed which enclose a number of regions of the semiconductor layer and isolate them from each other, information-forming charge in the form of majority charge carriers being stored in the regions.

It is to be noted that majority charge carriers are to be understood to mean those charge carriers the concentration of which in the electrically neutral equilibrium situation is at least a factor $10^2$ and preferably more than a factor $10^4$ larger than the concentration of charge carriers of the opposite polarity, the so-called minority charge carriers.

Since in addition the mobility of electrons generally is larger than that of holes, a further important reduction of the transport time relative to the known devices can be achieved at least when an n-type layer is used.

The majority charge carriers which are stored in a region which forms a first stage of the shift register can be moved to a subsequent second stage of the shift register by depleting the region by means of clock voltages applied via the electrodes. The dimensions, and the mutual distance of the electrodes are preferably chosen to be so that the charge transport takes place substantially entirely under the influence of the electric field in the semiconductor layer caused by the clock voltages. A preferred embodiment of a semiconductor device according to the invention is therefore characterized in that the width of the electrodes and the pitch distances between two successive electrodes are of the same order or smaller than the thickness of the semiconductor layer.

In this embodiment, the drift component as a result of the applied electric field dominates during the whole charge transport the diffusion current component, as a result of which a further reduction of the transport time is obtained. Since also towards the end of the transfer process each charge carrier is under the influence of the applied electric field, the transport efficiency in this embodiment can be very high.

It is to be noted that the electrodes need not be connected individually to a voltage source but that the electrode which belong, for example, to those regions of the semiconductor body which can each time contain information simultaneously, are connected together by a conductor which can be applied to a common potential.

During the charge transport from a first to a subsequent second stage, the charge stored in the first stage may not flow back to a preceding stage of the shift register adjoining the first stage. Therefore, a further preferred embodiment of a semiconductor device according to the invention is characterized in that the electrodes are subdivided into at least three groups in which the electrodes belong alternately to a first, a second and a third group and in which the electrodes belonging to a group are connected together by a conductor.

Since the electrodes are subdivided into at least three groups, the flow back of charge from a stage to a preceding stage can be prevented by means of an electric field which is applied via the electrodes and which forces the charge carriers in the direction of the subsequent stage.

The invention does not only present important advantages as regards the operation of the shift register relative to the known devices, it also presents several possibilities as regards the structure which can each be advantageously applied.

A first type of semiconductor device according to the invention is characterized in that all the electrodes are provided on one side of the semiconductor layer.

In this case, regions containing information-forming majority charge carriers and enclosed by depletion zones can be obtained which extend throughout the thickness of the semiconductor layer, the charge transport taking place mainly in a direction parallel to the surface and via the interior of the semiconductor layer.

In this embodiment a semiconductor body may be used which is formed only by the semiconductor layer which, not counting input or output members, if any, is fully surrounded by insulating material. In order to obtain a larger mechanical rigidity, the semiconductor layer may advantageously be provided on a support of an insulating material.

However, a further preferred embodiment of a semiconductor device according to the invention is characterized in that the semiconductor layer is formed by an island-shaped part of a layer-shaped region of a first conductivity type which adjoins a surface of the semiconductor body and which forms a p-n junction with a second region of the second conductivity type. In this embodiment the shift register may advantageously be integrated with other circuit elements, for example, transistors, diodes, resistors, etc. which constitute, for example, an input stage or an output stage of the shift register and which are provided in the semiconductor body in the usual manner.

The semiconductor layer may be formed for example, by an island in an epitaxial layer of a first conductivity type which is provided on a substrate of a second conductivity type, the island being surrounded by a cup-shaped isolation zone, the bottom of which is formed by the depletion zone, of the p-n junction between the substrate and the epitaxial layer, and the upright walls of which may be formed by the depletion zones between the epitaxial layer and isolation zones of the second conductivity type.

However, a preferred embodiment which inter alia has the advantage that in the isolation zones no inversion occurs as a result of the clock voltages at the electrodes is characterized in that the upright walls of the island-shaped parts adjoin an isolation zone which is formed at least partly by a layer of insulating material, for example silicon oxide, which is inset in the semiconductor layer over at least a part of its thickness.

The silicon oxide layer may extend from the surface of the semiconductor layer throughout the thickness of the semiconductor layer down to the region of the second conductivity type. However, it is also advantageously possible that the inset oxide layer extends from the surface of the semiconductor layer only over a part of the thickness of the semiconductor layer, the isolation zones being furthermore formed by zones of the second conductivity type which adjoin the oxide and which extend down to the region of the second conductivity type.

In the present embodiments, the depletion zones which during operation enclose information-containing regions of the semiconductor layer adjoin a region of the second conductivity type. As a result of this, accumulation of minority charge carriers which originate from the region of the second conductivity type may occur during operation at the interface between the semiconductor layer and the insulating layer in the depletion zones.

Charge accumulation which may result in inversion of the conductivity type in the depletion zones may advantageously be prevented in a preferred embodiment of the semiconductor device according to the invention which is characterized in that the region of the second conductivity type of the semiconductor body is provided with a connection conductor for connecting the region of the second conductivity type to a voltage source as a result of which inversion during operation is prevented.

A second type of a semiconductor device according to the invention is characterized in that the semiconductor layer comprises on two oppositely located sides electrodes which are separated from the semiconductor material by a barrier layer, preferably an insulating layer, and which are substantially parallel to each other.

The movement of the information-forming charge from one stage of the shift register to a subsequent stage may in this embodiment also have a component in a direction transverse to the semiconductor layer in addition to a component parallel to the semiconductor layer, the charge moving alternately from one major surface of the semiconductor layer to the other.

In this type of device the regions which comprise the information-containing charge need not extend throughout the thickness of the semiconductor layer when the charge density is none too high, but only over a part of the semiconductor layer as will become apparent from the description of the Figures hereinafter.

One of the advantages of such a device is that the structure can be very compact as a result of which delay lines with a large number of stages per unit length can be obtained.

According to a simple embodiment, the width of and the pitch distances between the electrodes which are provided on one side of the semiconductor layer, are equal to the width of and the pitch distance between the electrodes which are provided on the oppositely located side. Inter alia for reasons of symmetry, the electrodes which are provided on one side of the semiconductor layer are preferably shifted by half a pitch distance relative to the electrodes which are provided on the oppositely located side of the semiconductor layer.

A further preferred embodiment which inter alia has the important advantage of a further reduction of the transport time is characterized in that viewed in projection in a direction transverse to the major surfaces, an electrode which is provided on one side of the semiconductor layer partly overlaps two juxtaposed electrodes which are provided on the oppositely located side.

Since in this embodiment the electrodes provided on either side of the semiconductor layer overlap each other, the distances between two successive stages is approximately equal to the thickness of the semiconductor layer, as a result of which, compared with a device of the described first type, the electric field in the semiconductor layer, with the same voltage between two successive electrodes, is present throughout the transport range and moreover the distance over which the charge carriers are moved is very small.

In this type of semiconductor devices the electrodes are preferably subdivided into four groups, in which the electrodes belonging to the same group are connected together and each side of the semiconductor layer comprises only two groups in which the electrodes alternately belong to one of the groups.

A further advantage is that the electrodes can be connected together by conductors which do not cross each other on the same side of the semiconductor layer.

A following type of semiconductor device in which electrodes are provided on two oppositely located sides of the semiconductor layer is characterized in that, viewed in a direction transverse to the direction of charge transport, electrodes which are provided on one of the sides of the semiconductor layer are present opposite to the electrodes which are provided on the oppositely located side of the semiconductor layer.

In this type of semiconductor device, means are preferably present by which voltages of the same polarity and preferably of the same value can be applied to electrodes which, viewed in a direction transverse to the direction of charge transport, are present opposite to each other. In this embodiment the electrodes may be subdivided, for example, into a number of groups of electrodes in which the electrodes associated with a group are connected together by clock lines and in which electrodes which are situated directly opposite to each other belong to the same group.

In this type of semiconductor device, the charge transport during the transport of information-forming charge takes place mainly in a direction parallel to the semiconductor layer.

A further type of semiconductor devices according to the invention is characterized in that the semiconductor layer comprises two crossing groups of electrodes which are separated from each other and from the semiconductor material by a barrier layer, for example an insulating layer, the electrodes belonging to the same group being substantially parallel to each other and crossing the electrodes of the other group.

Such a type of shift register may be considered as a combination of two partial systems of which the operation is analogous to that of the already described first type. At the area of the cross-overs of the electrodes, minimal potential energy for the information-forming charge carriers can be created in the semiconductor layer in which the charge carriers can be stored. By means of electric fields applied via the electrodes the charge carriers can be moved in two directions crossing each other and preferably extending mutually substantially at right angles.

Such a semiconductor device may advantageously be used, for example, as a two-dimensional shift register, in which the charge transport shows either a component in each of the two directions or in only one of the directions.

As already described, in a semiconductor device according to the invention information in the form of majority charge carriers can be transported through the semiconductor layer. The information-forming charge should of course and preferably be read and removed at the end of the semiconductor layer or in some cases be returned to the input of the shift register. This can be done in a variety of manners.

A preferred embodiment of a semiconductor device according to the invention is characterized in that, viewed in the direction of the charge transport, an extra electrode which is insulated from the semiconductor layer by a barrier layer and which constitutes the gate electrode of an insulated gate field effect transistor is provided behind the last electrode, the region of the semiconductor layer which is present between the gate electrode and the last electrode constituting the source zone of the transistor, the region of the semiconductor layer behind the gate electrode, the drain zone, being connected to a conductor which constitutes a drain conductor for the information-forming charge carriers.

In case the gate electrode is insulated from the semiconductor layer by an insulating layer, for example of silicon oxide, a transistor is obtained of a type without p-n junctions which can very simply be manufactured and which is known in literature as "deep-depletion field effect transistor". Such a type of field effect transistor can be used in a semiconductor device according to the invention when majority charge carriers form the information-forming charge. The charger carrier can be transferred from the last stage of the shift register into the adjoining source zone of the field effect transistor, and then be drained therefrom.

For reading the information, the source zone of the transistor may be connected, for example, by a conductor, to a circuit element which is formed, for example, by a p-n diode which is provided in an island-shaped part of the semiconductor body which is insulated from the semiconductor layer.

However, a further preferred embodiment of the semiconductor device according to the invention is characterized in that the source zone of the transistor is conductively connected to the gate electrode of a second insulated gate field effect transistor, which transistor is further insulated from the semiconductor layer and comprises a source zone and drain zone with inbetween the channel region of which the conductivity is a measure of the information-forming quantity of charge carriers transported through the semiconductor layer.

This second field effect transistor preferably is also of the already described "deep-depletion FET" type, in which the source zone, the drain zone and the region between the source zone and the drain zone are of the same conductivity type as the semiconductor layer.

A further preferred embodiment of a semiconductor device, in particular a shift register, according to the invention is characterized in that the members for applying clock voltages are connected to at least a voltage source as a result of which local depletion zones are temporarily caused which extend through out the thickness of the semiconductor layer and which serve to bound one or more regions of the semiconductor layer in which information is stored. Information is to be understood to mean herein the quantity of charge which is stored in regions of the semiconductor layer in the form of mobile charge carriers (or the lack thereof), in which it is to be noted that in special cases a charge "zero" may also be considered as information.

The information-forming charge is advantageously formed by a quantity of majority charge carriers belonging to the one conductivity type of the semiconductor layer. For example, in the case in which the semiconductor layer is formed, for example, by a layer of n-type, for example, silicon doped with phosphorus atoms, the information-forming charge is formed by electrons. Since in this case the mobility of electrons is larger than that of holes, a considerable reduction of the transport time can be obtained, at least when using an n-type layer, as compared with known devices in which, when using an n-type layer, holes are just used as information carriers.

A further preferred embodiment of the semiconductor device according to the invention is characterized in that by applying the clock voltages, electric fields are caused in the semiconductor layer as result of which accumulation of majority charge carriers occurs at least in a number of the regions. Accumulation of majority charge carriers is to be understood to mean herein an at least local concentration of majority charge carriers in the semiconductor layer, which concentration is larger than the concentration of charge carriers belonging to the given doping concentration of the semiconductor layer in the electrically neutral condition.

At least in a number of the information-containing regions, the information-forming charge may, advantageously at least partly and preferably substantially entirely, be present at the surface of the semiconductor layer below the members. During the transport, the information-forming charge may be eliminated entirely or at least partly from the surface into the interior of the semiconductor layer where a faster transport is possible than at the surface of the semiconductor layer.

In order to obtain extra small transport times, an electric field is preferably produced during the transport of information-forming charge by means of the members in an information-containing region, as a result of which the charge carriers are driven from the region to a subsequent region. In this manner, for example, in the case in which the members are formed by metal electrodes which are separated from the semiconductor layer by an insulating layer, a voltage can be applied to an electrode belonging to an information-containing region, as a result of which, with the voltage at the electrode, the region is fully depleted from majority charge carriers and therefore the charge carriers are repelled from the region.

A further preferred embodiment of the semiconductor device according to the invention is characterized in that the members comprise electrodes which are separated from the semiconductor layer by a barrier layer in which at a first instant voltages are applied to four successive electrodes which are hereinafter termed first, second, third and fourth electrode, as a result of which depletion zones are formed in the semiconductor layer opposite to the first and the third electrode, which zones enclose a semiconductor region which is present opposite to the second electrode and in which information-forming charge carriers are stored, and that subsequently at a second instant the polarity of the voltage difference between the second electrode and the third electrode is reversed as a result of which the charge carriers are eliminated from the semiconductor region in the direction of the region present opposite to the third electrode and are stored there between depletion zones present opposite to the second and the fourth electrode.

In this embodiment the semiconductor device may be operated by means of, for example, three clock voltage sources and may therefore be considered as a three-phase system.

A further type of semiconductor device according to the invention is characterized in that the members comprise a row of electrodes which are separated from the semiconductor layer by a barrier layer, in which at a first instant voltages are applied to five successive electrodes which are hereinafter termed first, second, third, fourth and fifth electrodes, as a result of which depletion zones are present in the semiconductor layer opposite to the third and the fourth electrode, which zones extend transversely throughout the semiconductor layer, information-carrying charge in the form of mobile charge carriers being present at least in the region present opposite to the second electrode, in which, after a second instant, the polarity of the voltage difference between the first and the third electrode and that between the second and the fourth electrodes are reversed as a result of which the charge carriers are eliminated from the region present opposite to the second electrode and flow, at least for a part, via the region present opposite to the third electrode to the region present opposite to the fourth electrode and the information-carrying charge is enclosed between a depletion zone which is formed opposite to the second electrode and a depletion zone which is present opposite to the fifth electrode, which depletion zones both extend transversely through the semiconductor layer, the depletion zone formed opposite to the second electrode occupying the region present opposite to the electrode only at an instant at which the region present opposite to the first electrode is substantially entirely free from charge carriers.

Since the region present opposite to the first electrode is depleted entirely sooner than the region present opposite to the second electrode and from which information-carrying charge is eliminated, an asymmetry is introduced into the system which determines the direction of transport of the charge transport. The result hereof is, as will become apparent from the appended description of the Figures, that a semiconductor device according to this type of embodiment can be operated only by means of two clock voltage sources, therefore as a so-called two-phase system. The asymmetry can be obtained, for example, by providing an insulating layer of a varying thickness on the surface of the semiconductor layer. A preferred embodiment is characterized in that the first electrode is connected to the second electrode via a direct voltage source and the third electrode is connected to the fourth electrode via a direct voltage source, the resulting direct voltage difference between the first and the second electrode and between the third and the fourth electrode, respectively, ensuring that a depletion zone to be formed in the semiconductor layer opposite to the second and fourth electrode, respectively, can occupy entirely the region present opposite to the electrode only when first a depletion zone is present opposite to the first and the third electrode, respectively, and extends transversely through the semiconductor layer. In the case in which the semiconductor layer consists, for example, of n-type semiconductor material, the first and the third electrode are connected to the negative terminal and the second and the fourth electrode are connected to the positive terminal of the direct voltage sources. For example, a depletion zone can be formed opposite to the second electrode by applying a negative voltage to the electrode. Since, however, the first electrode has a larger negative potential as a result of the direct voltage source, a depletion zone which extends transversely through the layer will sooner be formed opposite to the first electrode than opposite to the second electrode.

A further preferred embodiment of a semiconductor device according to the invention is characterized in that by applying the voltages to the electrodes present on two oppositely located sides, the information-forming charge carriers cross alternately from one side of the semiconductor layer to the other side of the semiconductor layer, in which the charge transport shows, at least a number of times during the crossing of the semiconductor layer, also a component parallel to the semiconductor layer in addition to a component transverse to the semiconductor layer.

Figure 2:
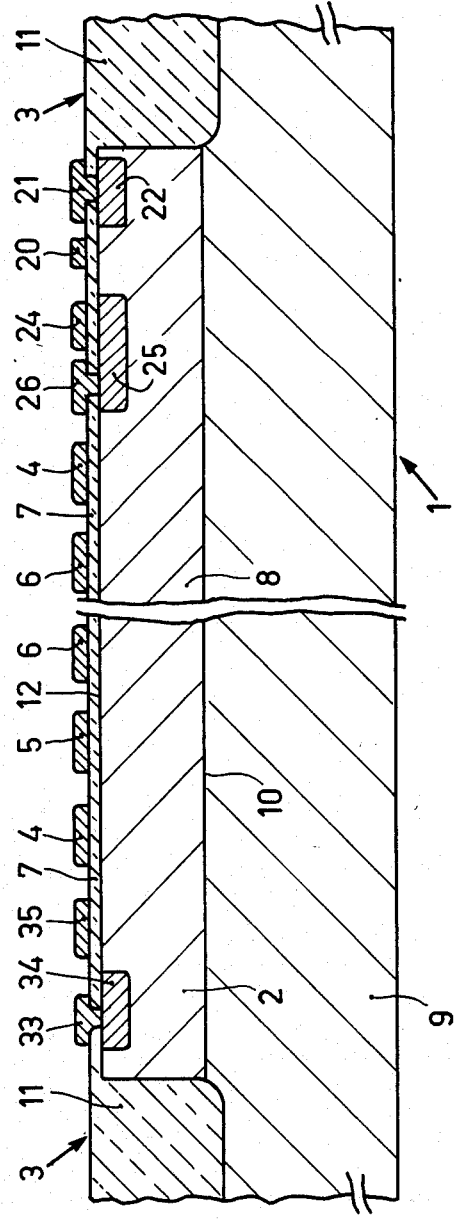
Figure 3:
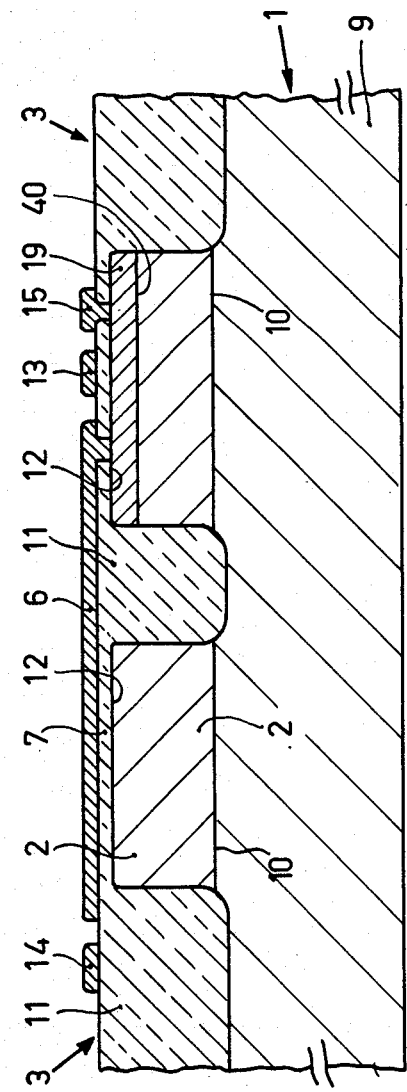
Figure 4:
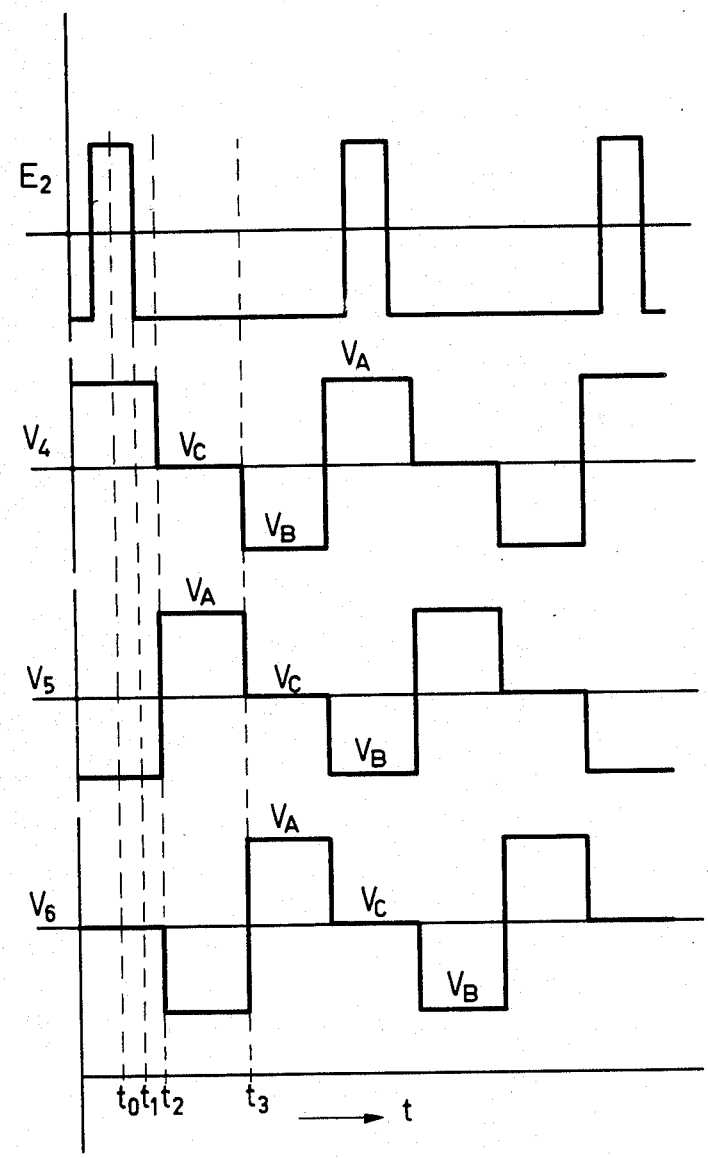
Figure 5:
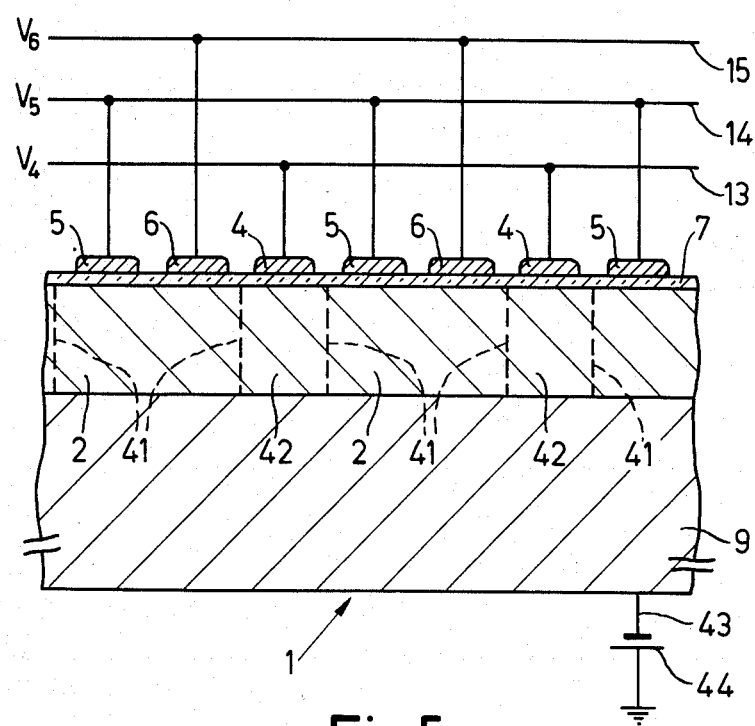
Figure 6:
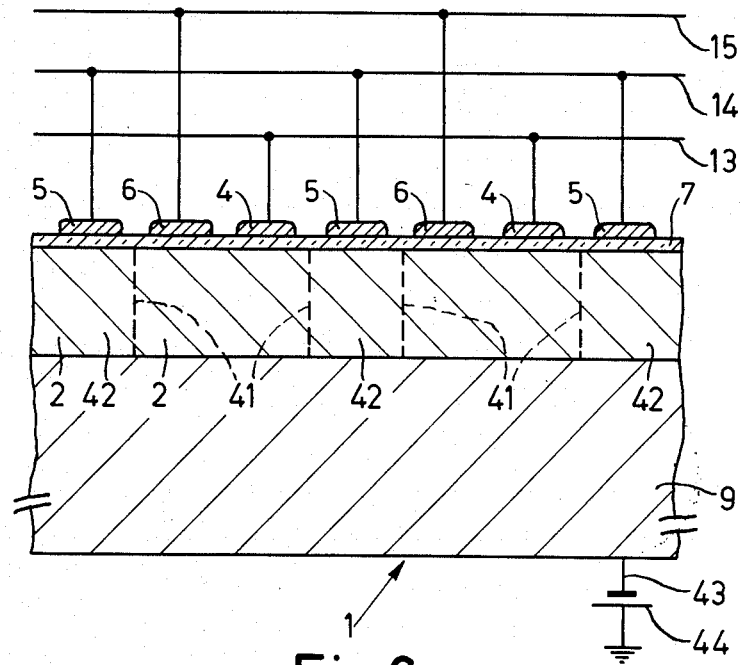
Figure 7:
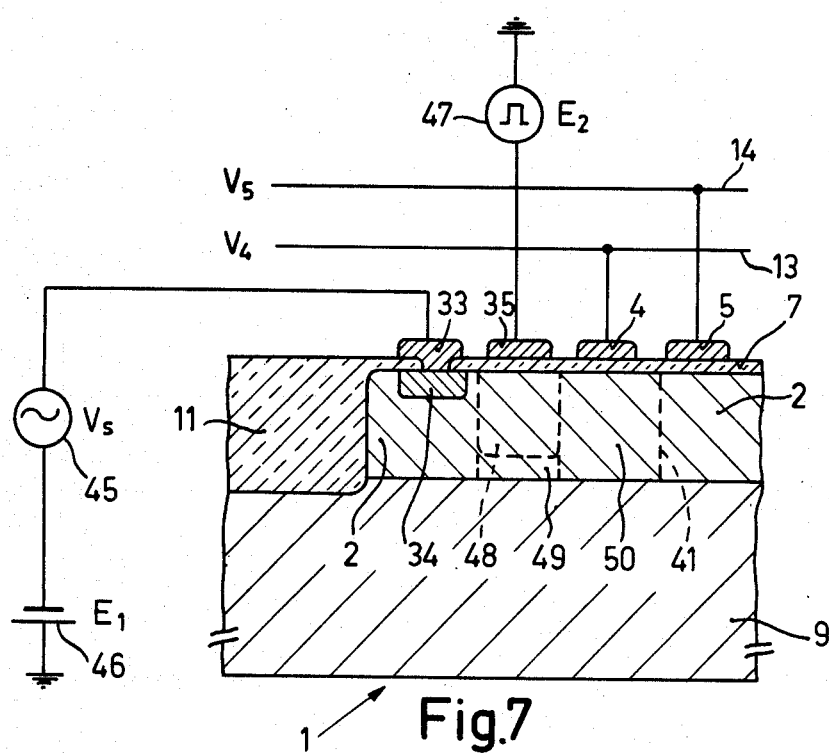
Figure 8:
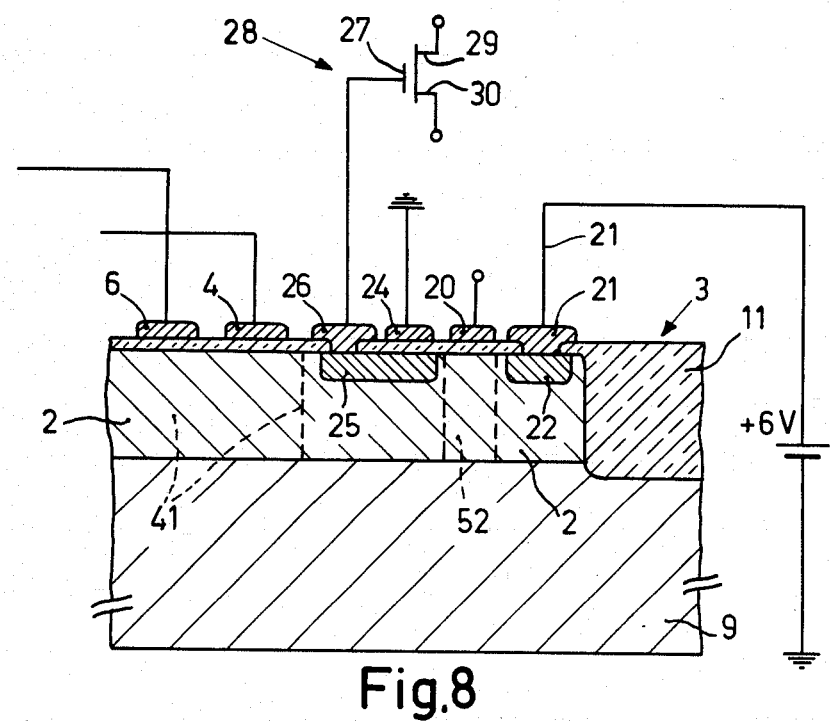
Figure 9:
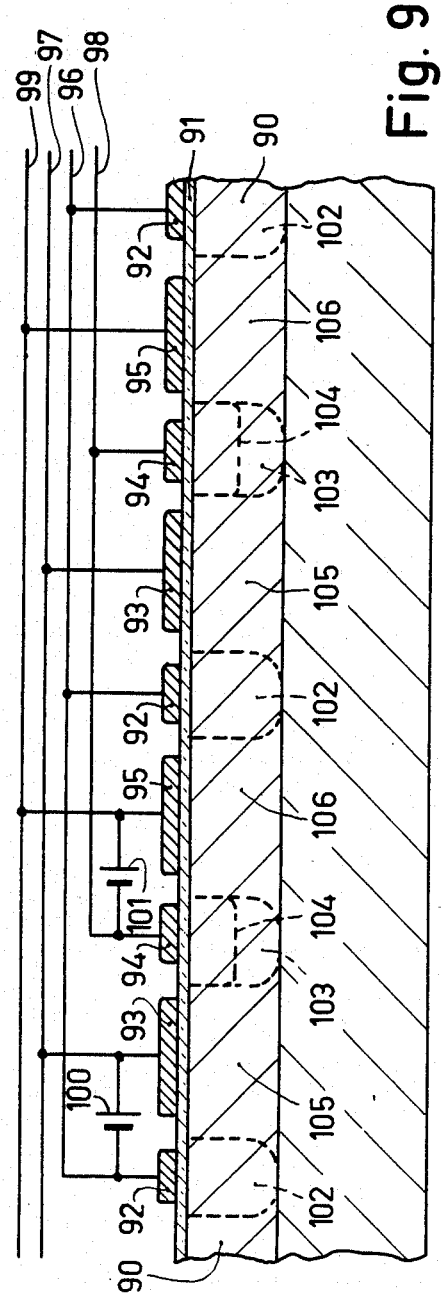
Figure 10:
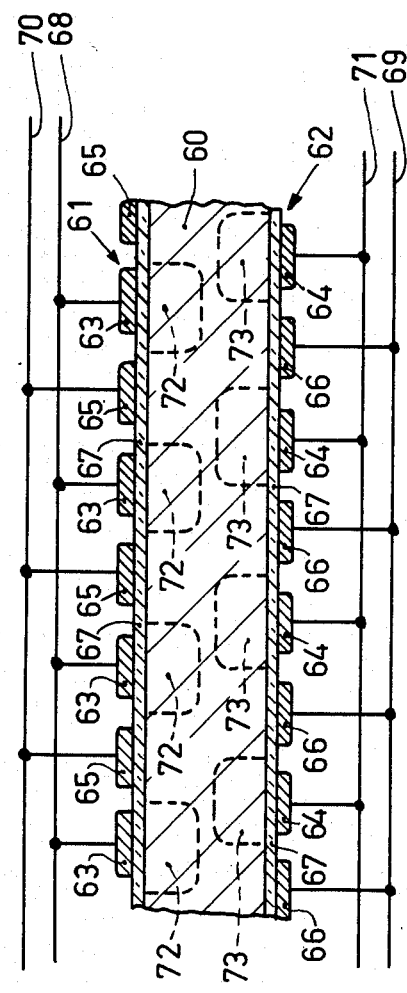
Figure 11:
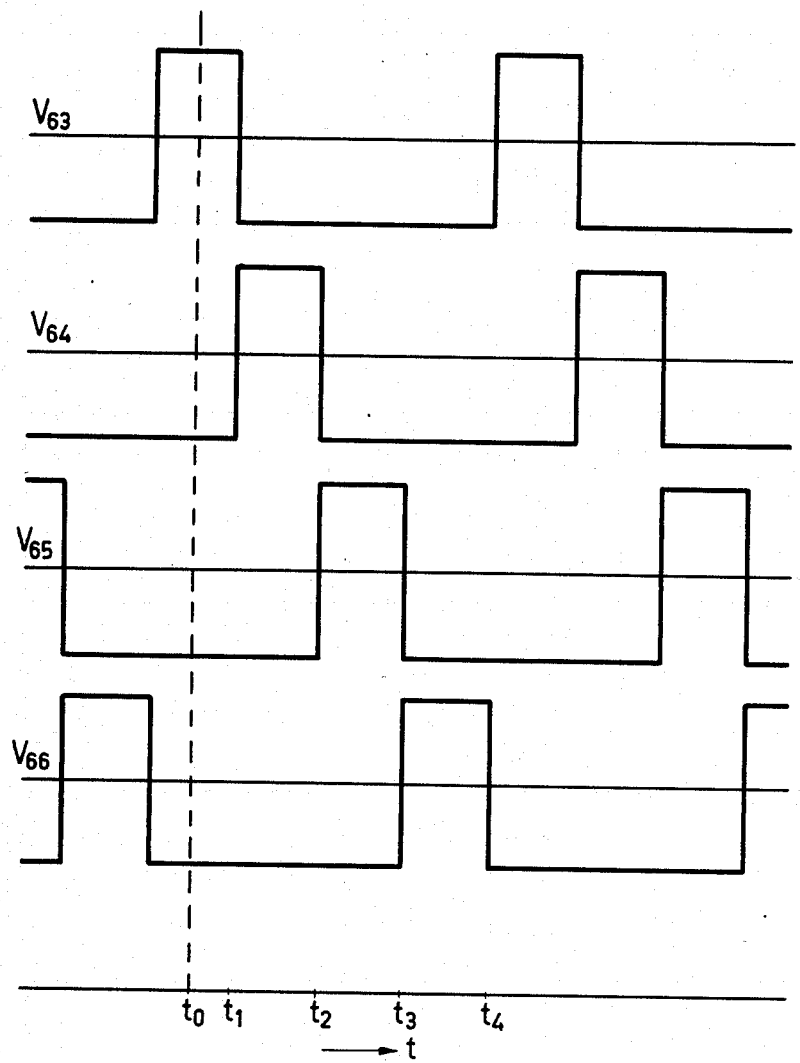
Figure 12:
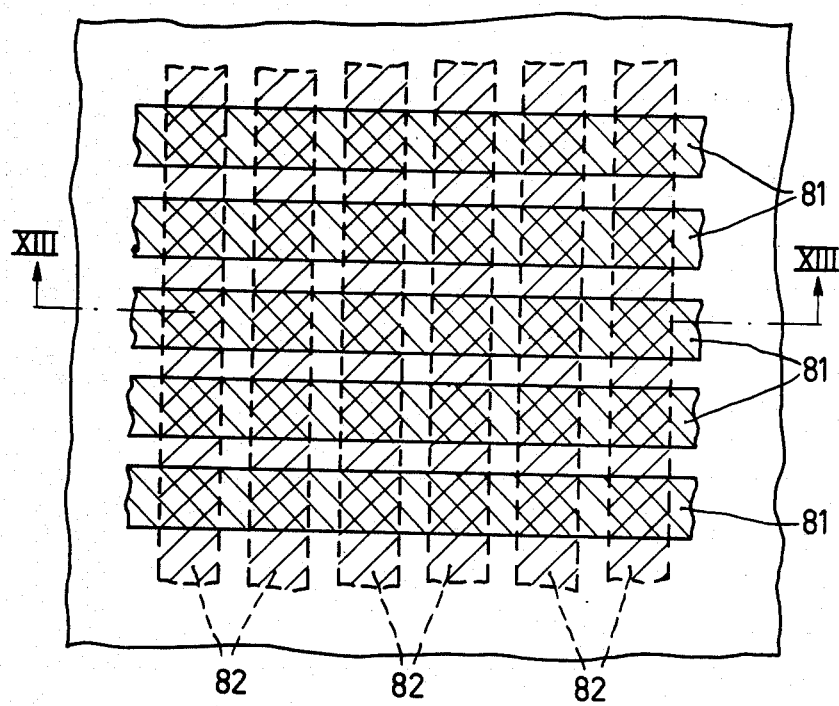
Figure 13:
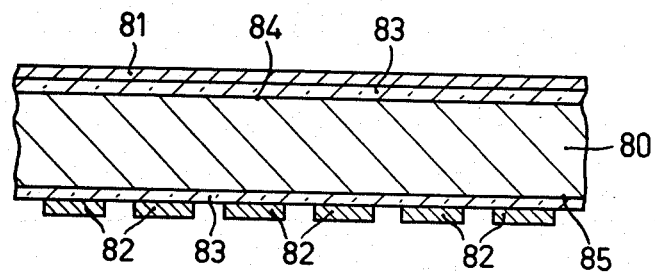
Figure 14:
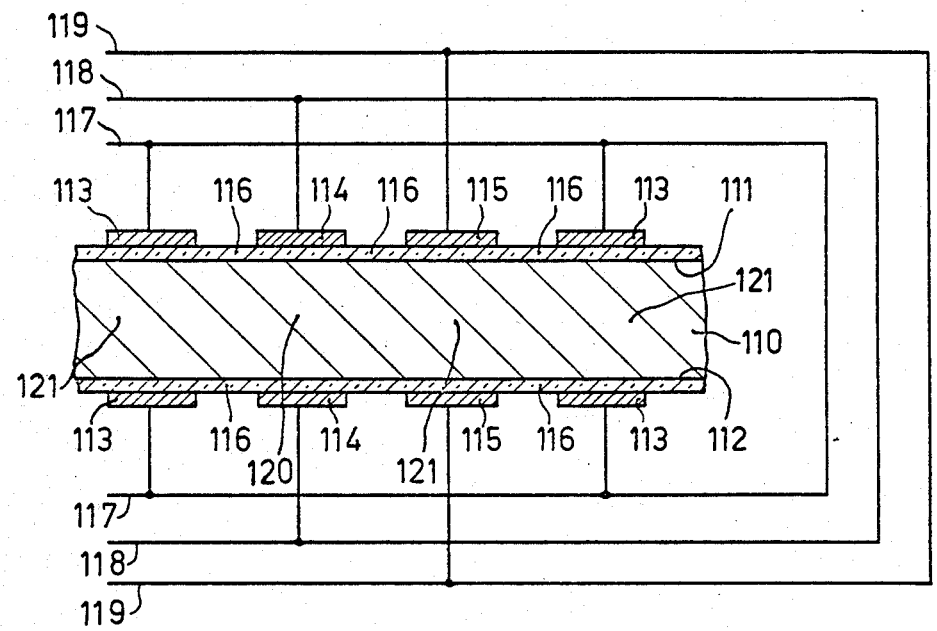

The invention will now be described in greater detail with reference to a few embodiments and the drawing, in which, FIG. 1 is a plan view of a semiconductor device according to the invention of which FIG. 2 is a diagrammatic sectional view taken on the line II—II of FIG. 1 and FIG. 3 is a diagrammatic sectional view taken on the line III—III of FIG. 1, FIG. 4 shows the clock voltages which are placed on the electrodes of the semiconductor device shown in FIG. 1 in accordance with time, FIGS. 5 and 6 are diagrammatic cross-sectional views of the same part of the semiconductor device as shown in FIG. 2 at several instants during operation, FIG. 7 shows another part of the semiconductor device shown in FIG. 1 during operation, FIG. 8 shows still another part of the semiconductor device shown in FIG. 2 during operation, FIG. 9 is a diagrammatic sectional view corresponding to the sectional view shown in FIG. 2 of a part of another semiconductor device according to the invention, FIG. 10 is a diagrammatic cross-sectional view of a part of a second type of the semiconductor device according to the invention, FIG. 11 shows the clock voltages which are placed on the electrodes of the semiconductor device as shown in FIG. 10 as a function of time, FIG. 12 is a plan view of a part of a third type of semiconductor device according to the invention, and FIG. 13 is a diagrammatic cross-sectional view of the semiconductor device taken on the line XIII—XIII of FIG. 12, FIG. 14 is a diagrammatic cross-sectional view of a part of a further type of a semiconductor device according to the invention.

The Figures are diagrammatic and not drawn to scale. Corresponding parts are generally referred to by the same reference numerals in the various Figures.

FIG. 1 is a diagrammatic plan view and FIGS. 2 and 3 are diagrammatic cross-sectional views taken on the lines II—II and III—III, respectively, of FIG. 1 of a part of a semiconductor device, in this case a shift register, according to the invention.

The semiconductor device comprises a semiconductor body 1 having a semiconductor layer 2 of n-type silicon. The semiconductor device furthermore comprises means to locally introduce information in the form of electric charge into the semiconductor layer 2 and means to read said charge elsewhere on the layer 2 as will be described in detail hereinafter.

On the semiconductor layer 2, on at least one side 3 of the layer 2, members are present for applying clock voltages the members being formed by the electrodes 4, 5 and 6 which are separated from the semiconductor layer 2 by a barrier layer 7.

In the present embodiment, the barrier layer 7 is formed by an insulating layer of silicon oxide. The electrodes 4, 5 and 6 are formed by metal tracks of aluminium and serve to provide clock voltages, as a result of which the charge is transported through the semiconductor layer 2 in a direction parallel to the layer 2.

According to the invention the semiconductor layer 2 is insulated at least during operation from the surroundings, except for introducing and removing the charge, as a result of which the electric fields present in the semiconductor layer 2 and influencing the electric charge are mainly determined by the clock voltages applied to the electrodes 4, 5 and 6.

In a direction transverse to the direction of charge transport, the electrodes 4, 5 and 6 extend at least across the semiconductor layer 2, as may be seen from FIGS. 1 and 2.

In the present embodiment the thickness and the doping concentration of the semiconductor layer 2 are approximately 5 $\mu$m and $10^{15}$ at/cm$^3$, respectively. The thickness and doping concentration are so small that in the semiconductor layer 2 transverse thereto an electric field can be applied the field being of such a strength that a depletion zone is formed throughout the thickness of the layer 2 but that avalanche multiplication does not yet occur.

In the present embodiment, electrodes are provided only on one side, namely the side 3 of the semiconductor layer 2.

The semiconductor layer 2 is formed by an island-shaped part of a layer-shaped region 8 of n-type silicon which adjoins a surface 12 of the semiconductor body 1 and forms a p-n junction 10 with a second region 9 of p-type silicon.

The layer-shaped region 8 consists of an epitaxial layer which is deposited in the usual manner on the second region 9 which forms a substrate.

The upright walls of the island-shaped parts 2 are bounded by an isolation zone 11 which is formed at least partly by a layer of silicon oxide which is inset in the epitaxial layer 8 over at least a part of its thickness.

The isolation zone 11 in the present embodiment is formed entirely by a layer of silicon oxide which extends from the surface 12 of the semiconductor body 1 throughout the thickness of the eptiaxial layer 8 and reaches down to in the substrate. In addition the oxide layer 11 is inset substantially throughout its thickness in the semiconductor body so that a substantially flat surface is obtained.

Therefore, the semiconductor layer 2 is officaciously isolated from the surroundings by the inset silicon oxide layer and the p-n junction 10 and the insulating layer 7. Moreover, the shift register described can be integrated without difficulty in the same semiconductor body together with other circuit elements, for example, transistors, resistors etc.

The electrodes 4, 5 and 6 in the present embodiment are subdivided into three groups, in which the electrodes which belong to a first group are denoted by 4, the electrodes which belong to a second group are denoted by 5 and the electrodes which belong to the third group are denoted by 6. The groups are chosen to be so that the electrodes belong alternately to the first, second and third group.

Furthermore the electrodes belonging to the same group are connected together and to contact surfaces 16, 17 and 18 by conductors 13, 14 and 15 for providing clock voltages. It is to be noted that the electrodes 6 are connected to the conductor 15 via low-ohmic n-type semiconductor zones 19 which have a higher doping than the epitaxial layer 8 and are provided in islands 40 which are insulated from the semiconductor layer 2 by the inset oxide layer 11. The semiconductor zones 19 cross the conductor 13 and are separated therefrom by the insulating layer 7 which comprises apertures for contacting on the one hand the electrodes 6 and on the other hand the common conductor 15.

The shift register furthermore comprises means to read and remove a quantity of information-forming charge transported through the semiconductor layer 2.

For that purpose, an extra electrode 20 which is separated from the semiconductor layer 2 by the insulating layer 7 and which forms the gate electrode of an insulated gate field effect transistor is provided behind the last electrode 4 viewed in a direction of the charge transport.

The highly doped n-type region 25 of the semiconductor layer 2 which is present between the gate electrode 20 and the last electrode (see FIG. 2) constitutes the source zone of the field effect transistor and the highly doped n-type region 22 behind the gate electrode constitutes the drain zone.

The drain zone 22 is connected to a conductor 21. The conductor 21 is connected to a contact pad 23 for connecting an external conductor by means of which the information-forming charge can be drained.

It is to be noted that the field effect transistor does not show any p-n junction, which considerably simplifies its manufacture. It is furthermore to be noted that a further electrode 24 which is also separated from the semiconductor layer 2 by the insulating layer 7 is present between the gate electrode 20 and the last electrode. Electrode 24 is applied to a fixed potential during operation so as to obtain a reference voltage.

The source zone 25 of the transistor is connected, via an aperture in the insulating layer 7, to the conductor 26 and to the gate electrode 27 of a second insulated gate field effect transistor.

The second field effect transistor which is denoted by 28 in FIG. 1 is provided in an island of the semiconductor body 1 and insulated from the semiconductor layer 2 with the exception of the gate electrode 27.

The transistor 28 comprises a source zone 29 and a drain zone 30 which are provided with connection conductors 31 and 32, respectively, having therebetween the channel region the conductivity of which is a measure of the information-forming quantity of charge carriers transported through the semiconductor layer 2, as will be described in detail hereinafter.

The source step 29 and the drain zone 30 of the transistor 28 and the region between the source zone and the drain zone are of the same conductivity type as the semiconductor layer 2, so entirely of n-type silicon, as in the above-mentioned transistor.

The shift register furthermore comprises means to introduce the information-forming charge. For that purpose, the semiconductor layer 2 (see FIGS. 1 and 2) is provided at its other end with a connection conductor 33 which is connected, via an aperture in the insulating layer 7, to a low-ohmic n-type contact zone 34. The connection conductor 33 may be connected to an external signal source, for example, a voltage source, the signals of which are to be delayed by the shift register.

An electrode 35 which may be connected, if desirable, to the common conductor 15 is provided between the conductor 33 and the first electrode 4 (see FIGS. 1 and 2). In the present embodiment, however, the electrode 35 is connected to a contact pad 36 by means of which the electrode 35 can be connected to a separate external voltage source.

The operation of the semiconductor device as described with reference to FIGS. 1 to 3 will now be further explained with reference to the diagrammatic FIGS. 4 to 6. It will first be described in what manner charge carriers are moved from one stage of the shift register to a subsequent stage. For that purpose, FIGS. 5 and 6 show a part of the semiconductor device shown in FIG. 2, which part comprises a few of the electrodes 4, 5, 6. The conductors 13, 14 and 15 which connect the electrodes belonging to the same group together are shown diagrammatically in FIGS. 5 and 6. By means of these conductors, the clock voltages $V_4$, $V_5$ and $V_6$ are placed on the electrodes 4, 5 and 6, respectively, the variation of voltages being shown in FIG. 4 as a function of time. As may be seen from this Figure, $V_4$, $V_5$ and $V_6$ each show three levels relative to a reference potential, for example relative to earth, namely a positive voltage $V_A$ of approximately 5 Volt, a negative voltage $V_B$ of approximately $-5$ Volt and $V_C$ between $V_A$ and $V_B$ of approximately 0 Volt. The voltage differences $(V_A - V_B)$ and $(V_A - V_C)$ are such that two depletion zones 41 are formed in the semiconductor layer which extend throughout the thickness of the layer 2 (FIG. 5).

Since moreover the electrodes 4, 5 and 6 extend in a direction transverse to the direction of charge transport throughout the width of the semiconductor layer 2, the depletion zones 41 enclose a number of regions 42 of the semiconductor layer 2 which are insulated from each other and adjoin the insulating layer 7.

Information-forming charge which in the present embodiment consists of majority charge carriers, or electrons, is stored in the regions 42.

In order to insulate the information-carrying semiconductor layer and in order to prevent that during operation holes are attracted by the electrodes from the p-type substrate and collect in the depletion zone 41, which may result in recombination of holes and information-forming electrons, the n-type substrate 9 is connected, via a connection conductor 43, to a voltage source 44 as a result of which the potential of the substrate 9 is sufficiently negative relative to the electrodes 4, 5 and 6 to prevent charge collection.

For clarity it is to be noted that the blocked p-n junction between the substrate 9 and the layer 2 in FIGS. 5 and 6 is shown diagrammatically by a single line. In fact, however, a depletion layer is present at the junction between the substrate 9 and the layer 2 and extends partly in the substrate 9 and partly in the layer 2. The depletion zones 41 will therefore not extend entirely up to the line 10 but only up to the depletion layer between the substrate 9 and the layer 2.

The starting point is, for example, an instant between $t_0$ and $t_1$ (see FIG. 4) at which the electrodes 4 are at the positive voltage $V_A$ and the electrodes 5 and 6 at the voltages $V_B$ and $V_C$, respectively, as a result of which the situation shown in FIG. 5 is obtained. It is assumed that an information-forming quantity of electrons is present in the regions 42 which are insulated from each other by the depletion zones 41.

At the instant $t=t_2$, the electrodes 4 are placed at earth potential $V_C$, the electrodes 5 at the positive voltage $V_A$ and the electrodes 6 at the negative voltage $V_B$.

As a result of the voltage difference between the electrodes 4 and 5, which has now changed sign, the electrons present in the region 42 are now removed from the region and flow in the direction of an adjacent electrode 5. As a result of this the region 42 is depleted while a part of the adjoining depletion zone 41 present below the electrode 5 and adjoining the region 42 is filled with electrons originating from the region 42.

Although in the present embodiment the semiconductor device is operated by means of clock voltages which show three voltage levels $V_A$, $V_B$ and $V_C$, it is, of course, also possible to operate said device by means of clock voltages having only two levels, for example, by choosing the level $V_C$ to be equal to the level $V_B$, which is sufficient to produce a movement of charge. In the present embodiment, however, the electrodes 6 are placed at the extra negative voltage $V_B$ relative to the electrodes 4 as a precaution measure to prevent that during the charge transport electrons could flow in the opposite direction.

The result of the change of the clock voltages at the electrodes is that the hole pattern in the semiconductor layer 2 is shifted over a distance of the pitch distance between the electrodes, as is shown in FIG. 6.

In an analogous manner, the charge is moved again at the instant which is denoted in FIG. 4 by $t_3$, the electrode 6 being placed at the positive voltage $V_A$, the electrode 4 at the negative voltage $V_B$ and the electrode 5 at earth potential $V_C$, the electrons stored in the regions 42 moving in the direction from the electrodes 5 to the electrodes 6.

In this manner the charge can be further transported to the output of the shift register through the semiconductor layer 2 in a direction parallel to the layer 2.

The charge transport takes place mainly via the interior of the semiconductor material, so that the transport time is mainly determined by the mobility of the charge carriers in the interior of the semiconductor material. For silicon, this is a factor 1 to 3 larger than the mobility along the surface of the semiconductor layer 2, so that the transport time in the semiconductor device according to the invention described here may be coniderably smaller than the transport time in known shift registers in which the charge transport takes place entirely along the surface.

Since furthermore the average distance between the electrodes and the charge carriers is larger than in the known devices in which the distance is equal to the thickness of the insulating layer 7, an extra reduction of the transport time is obtained in that the capacitive coupling between the charge carriers and the electrodes is smaller.

The question of how the electrons which form the information-facing charge can be introduced into the shift register will now be considered further. For that purpose, FIG. 7 shows diagrammatically a part of the semiconductor device shown in FIG. 2, namely the part which comprises the input.

As shown in FIG. 7, the electrode 33 is connected to earth via a signal source 45 and a voltage source 46, while the electrode 35 is connected to earth via the sampling voltage source 47. The voltage $E_1$ supplied to by the voltage source 46 is 3 volts. The voltage source 47 supplies voltage pulses $E_2$ between $+5$ volts and $-5$ volts relative to earth, as is shown in FIG. 4. The starting point is again the instant denoted by $t_0$ in FIG. 4 at which the electrodes 4 are at the positive voltage $V_A$ and the electrodes 5 at the negative voltage $V_B$. Below the electrodes 5 there is thus a depletion zone 41 which extends throughout the thickness of the semiconductor layer 2.

The voltages $V_A$, $E_1$ and $E_2$ are chosen to be so that, when the electrode 35 is at its maximum potential, the part 50 of the semiconductor layer 2 present below the electrode 4 (see FIG. 7) is connected to the voltage source 45 via channel 49 extending over at least a part of the thickness of the layer 2. The potential of the region 50, which potential determines the electron density in said region, therefore is equal to $E_1+V_S$, where $V_S$ is the voltage supplied by the signal source 45.

At the instant $t_1$ the electrode 35 is placed at its minimum potential as a result of which a depletion zone 48 is formed below the electrode 35 and extends throughout the thickness of the layer 2, as a result of which the signal source 45 and the region 50 of the layer 2 are insulated from each other. The electrons stored in the region 50 and forming a measure of the signal $V_S$ are transported through the semiconductor layer 2 in the manner already described.

The way in which the charge transported through the semiconductor layer 2 is read and drained will now be described with reference to FIG. 8. FIG. 8 shows diagrammatically a part of the semiconductor device, which part contains the output of the shift register at the right-hand end of the layer 2 shown in FIG. 2. Moreover, FIG. 8 shows diagrammatically the insulated gate field effect transistor 28 the gate electrode 27 of which is conductively connected to the source zone 25 of the insulated gate "deep-depletion field effect transistor" (25, 20, 22) present in the semiconductor layer 2.

FIG. 8 shows the situation in which the electrode 4 are at earth potential $V_C$ and the electrodes 6 are at the negative potential $V_B$. At the same time, the electrode 20 which constitutes the gate electrode of the insulated gate field effect transistor is at such a negative potential that the depletion zone 52 is formed in the layer 2. The depletion zone 52 extends throughout the thickness of the semiconductor layer 2 and thus separates the source zone 25 from the drain zone 22 of the transistor.

In the part of the semiconductor layer 2 between the depletion zone 41 and 52, which part comprises the source zone 25, an information-forming quantity of electrons is stored which in cooperation with the electrode 24 placed at a fixed potential determines the potential of the source zone 25. This voltage determines the conductivity of the channel of the transistor 28 of which the source zone 29 and the drain zone 30 are connected to a voltage source which is not shown in FIG. 8. The current through the transistor 28 is controlled by the quantity of electrons in the semiconductor layer 2 and therefore constitutes a measure of the signals transported through the semiconductor layer 2.

After reading out, the voltage at the electrode 20 may be decreased so that between the source zone 25 and the drain zone 22 a conductive channel is formed through which the charge stored in the source zone 25 can be drained via the drain zone 22 and the conductor 21.

In the example described the electrodes 4, 5 and 6 are subdivided into three groups which are each connected to a clock voltage source. It is also possible, however, to operate a semiconductor device according to the invention by means of only two clock voltage sources, as will become apparent from the following embodiment. FIG. 9 is a digrammatic sectional view corresponding to FIG. 2 of a part of a semiconductor device according to the invention in which only two groups of electrodes are connected to a clock voltage source.

The semiconductor device comprises a semiconductor layer 90 of n-type silicon which has the same thickness and doping concentration as the semiconductor layer 2 in the preceding example. The semiconductor layer 90 comprises electrodes 92, 93, 94 and 95 which are insulated from the semiconductor layer by a silicon oxide layer 91.

The electrodes are subdivided into four groups in which the electrodes belonging to the same group and which are denoted by the same reference numerals are connected together by conductors which are shown diagrammatically in FIG. 9 by the connection lines 96, 97, 98 and 99.

A voltage source 100 is incorporated between the electrodes 92 and 93 and a voltage source 101 is incorporated between the electrodes 94 and 95, the electrodes 92 and 94 being connected to the negative terminal and the electrodes 93 and 95 being connected to the positive terminal of said voltage sources.

As a result of said voltage sources, depletion zones 102 and 104, respectively, which, dependent upon the voltages at the electrodes 93 and 95, extend or do not extend throughout the thickness of the semiconductor layer 90 are formed in the semiconductor layer 90 below the electrodes 92 and 94. The depletion zones 102 and 104 are shown in broken lines in FIG. 9. By placing, for example, the electrodes 95 at a positive potential the depletion zones 103 become smaller as a result of which they no longer extend throughout the thickness of the semiconductor layer 90 but only over a part of the layer 90 which is denoted in FIG. 9 by the broken lines 104. By placing the electrodes 93 at a negative potential, electrons which are stored in the regions 105 below the electrodes 93 are introduced along the foot of the depletion zone 104 into the regions 106 below the electrodes 95. The regions 106 are insulated from each other by the depletion zones 102 which extend throughout the thickness of the semiconductor layer 90. During said charge transport, in which the regions 105 are depleted, the charge carriers move mainly via the interior of the semiconductor layer 90.

An embodiment of a second type of semiconductor device according to the invention which inter alia has the advantage that the structure can be very compact will now be described with reference to FIG. 10. In this embodiment, a part of which is shown in the sectional view of FIG. 10, the semiconductor layer 60 comprises electrodes 63, 64, 65 and 66 on two oppositely located sides 61 and 62.

Viewed in a direction transverse to the direction of charge transport, the electrodes 63, 64, 65 and 66 also extend transversely across the whole semiconductor layer 60 and are separated from the semiconductor layer 60 by a barrier layer 64.

In the present embodiment the electrodes and the barrier layer are also formed by metal tracks of aluminium and an insulating layer of silicon oxide, respectively.

The electrodes 63, 64, 65 and 66 extend substantially in parallel with each other.

The width of and the pitch distances between the electrodes 63 and 65 in the present embodiment are equal to the width of and the pitch distances between the electrodes 64 and 66, respectively.

Inter alia for reasons of symmetry, the electrodes 64 and 66 which are provided on the side 62 of the semiconductor layer 60 are shifted by half a pitch distance relative to the electrodes 63, 65 which are provided on the side 61 of the semiconductor layer 60.

Moreover, in this embodiment the electrodes are provided so that, viewed in projection in a direction transverse to the main surfaces 61, 62, an electrode which is provided on one side 61 of the semiconductor layer 60, for example an electrode 63, partly overlaps two juxtaposed electrodes 64, 66 which are provided on the oppositely located side 62.

As a result of this the distance between two successive stages of the semiconductor device is approximately equal to the thickness of the semiconductor layer 60, which means that the electric fields which control the charge transport can become extra large, while in addition the distance over which the charge carriers are to be moved is very small.

The electrodes 63, 64, 65 and 66 are subdivided into four groups, the electrodes belonging to a first group being denoted by 63, the electrodes belonging to a second group being denoted by 64, the electrodes belonging to a third group being denoted by 65, and the electrodes belonging to a fourth group being denoted by 66.

The electrodes belonging to the same group are connected together by conductors 68, 69, 70 and 71 which are shown only diagrammatically in FIG. 10.

Only two groups of electrodes are provided on each of the sides 61, 62, the electrodes 63 and 65 being provided on the side 61 and the electrodes 64 and 66 being provided on the side 62.

As a result of this, the electrodes can be connected together by conductors which need not cross each other on either side of the semiconductor layer, in contrast with the preceding embodiment.

The semiconductor layer 60 in the present embodiment formed by an n-type silicon layer of a thickness of approximately 7 /u and a doping concentration of approximately $4.10^{14}$ at/cm$^3$.

The principle of the operation of this type of semiconductor devices will now be described with reference to FIGS. 10 and 11. FIG. 11 shows the clock voltages $V_{63}$, $V_{64}$, $V_{65}$ and $V_{66}$ which are placed on the electrodes 63, 64, 65, 66, respectively, as a function of time. As in the preceding embodiment the information-forming charge is formed by electrons which, for example, in the manner as already described in the preceding embodiment, can be supplied and drained, respectively, to the input and output not shown in FIG. 10.

Starting point is, for example, the instant denoted in FIG. 11 by $t_0$ at which the electrodes 63 are at a positive potential relative to the remaining electrodes 64, 65 and 66. As a result of this voltage differences between the electrodes 63 on the one hand and the remaining electrodes on the other hand, the information forming electrons are attracted by the electrodes 63 and stored in the regions 72 adjacent the electrodes 63, which regions are denoted in FIG. 10 by broken lines.

The semiconductor material surrounding the regions 72 is depleted so that the regions 72 are insulated from each other.

At the instant $t_1$ (see FIG. 11) the electrodes 64 are placed at a positive potential relative to the electrodes 63, 65 and 66, as a result of which the electrons stored in the regions 72 are attracted by the electrodes 64 and stored in the regions 73 adjacent the electrodes 64 which regions are also shown in broken lines in FIG. 10.

In the following phases of the clock voltages shown in FIG. 11 the electrons are transported in an analogous manner from the electrodes 64 in the direction of the electrodes 65 and then from the electrodes 65 in the direction of the electrodes 66.

The movement of the information-forming charge from one stage of the shift register to a subsequent stage, thus has, in addition to a component parallel to the semiconductor layer 60, also a component transverse to the semiconductor layer 60, the charge moving alternately from one of the two major surfaces 61 and 62 to the other.

The charge transport takes place entirely via the interior of the semiconductor layer 60 so that the transport time in said type of semiconductor device may be very small.

Since furthermore the distance between the electrodes belonging to successive stages of the shift register, for example between the electrodes 63 and 64, is substantially equal to the thickness of the semiconductor layer 60 as a result of the partial overlap of the electrodes, the transport distance is substantially determined only by the thickness of the semiconductor layer 60.

FIG. 12 is a plan view and FIG. 13 a cross-sectional view taken on the line XIII—XIII of FIG. 12 of a part of a further type of semiconductor device according to the invention in which a semiconductor layer 80 of n-type silicon is provided with two crossing groups of electrodes, the electrodes belonging to one group being denoted by 81 and the electrodes belonging to the other group being denoted by 82.

The electrodes 81 and 82 are formed by conductive tracks of aluminium which are separated from the semiconductor layer 80 by a barrier layer 82 of silicon oxide.

The electrodes belonging to the same group extend substantially in parallel with each other and cross the electrodes of the other group at an angle of approximately 90°.

In the present embodiment the electrodes 81 and 82 are provided on two oppositely located major surfaces 84 and 85 of the semiconductor layer 80.

This type of semiconductor device may be considered, for example, as a combination of two partial systems of which the operation is analogous to that of a device of the type described in the first embodiment and in which the semiconductor layer 80 is common for both partial systems, the system comprising the electrodes 81 constituting the one partial system and the system comprising the electrodes 82 constituting the other partial system.

The electrodes belonging to the same group may be set up at clock voltages as is shown in FIG. 4 in which thus after every two electrodes with a negative voltage an electrode with a positive voltage relative to said two electrodes follows. The electric field applied in the semiconductor layer 80 via the electrodes will vary so that information-forming electrons are driven to those places in the semiconductor layer 80 where the distance between the electrodes with positive voltage is smallest, that is to say at the cross-overs.

By operating the clock voltages at the electrodes 81 and 82 either separately or simultaneously, the information-forming charge can be moved through the semiconductor layer 80, for example, in a direction parallel to the electrodes 81 or in a direction parallel to the electrodes 82, or in another direction with components parallel to the electrodes 81 and 82.

A further embodiment of a semiconductor device, in particular a shift register, according to the invention, will now be described with reference to FIG. 14. In this embodiment, of which a part is shown in FIG. 14 as a cross-sectional view corresponding to that of the embodiment shown in FIG. 10, the semiconductor layer 110 is provided on two oppositely located sides 111 and 112 with electrodes 113, 114 and 115 which extend parallel to each other and, viewed in a direction transverse to the direction of charge transport, transversely across the semiconductor layer 110. The electrodes 113, 114 and 115 are separated from the semiconductor layer 110 by a barrier layer 116 of silicon oxide, which layer 110 may be substantially identical to the semiconductor layer 60 of the shift register shown in FIG. 10. The electrodes, as in the preceding embodiments, may be formed by conductive layers of, for example, aluminium.

In contrast with the embodiment described with reference to FIG. 10, the electrodes 113, 114 and 115 are provided so that, viewed in a direction transverse to the direction of charge transport, an electrode which is provided on one side, for example, the side 111, is present opposite to an electrode which is provided on the side 112.

In the present example, electrodes which are provided on either side of the semiconductor layer 110 and mutually. extend straight opposite to each other and are denoted in FIG. 14 each time by the same reference numerals, are connected together via clock lines 117, 118 and 119. By means of said clock lines, voltages of the same polarity and the same value can be applied to oppositely located electrodes at any instant.

In the present embodiment the electrodes 113, 114 and 115 are subdivided into three groups of electrodes in which a first group is formed by the electrodes 113 which are connected together by the clock lines 117 and in which a second group is formed by the electrodes 114 which are connected together by the clock line 118 and in which the electrodes 115 which are connected together by the clock line 119 belong to the third group of electrodes.

Via the clock lines 117, 118 and 119, for example, the voltages $V_4$, $V_5$ and $V_6$ as shown in FIG. 4 can be applied to the electrodes 113-115, in which, for example, at the instant $t_0$ denoted in FIG. 4 the electrodes 114 are brought at the voltage level $V_A$, the electrodes 113 at the level $V_C$ and the electrodes 115 at the level $V_B$. Information-carrying majority charge carriers can be stored in the semiconductor region 120 between the electrodes 114, while the region 120 is bounded by a depletion region 121 which extends in the semiconductor layer 110 between the electrodes 113 and between the electrodes 115 through out the thickness of the semiconductor layer 110.

At the instant denoted by $t_1$ in FIG. 4, the electrons stored between the electrodes 114 are driven and stored between the electrodes 115 which are now brought at the positive voltage level $V_A$, while the electrodes 114 are brought at the lower voltage level $V_C$ in which the information has reached a subsequent stage of the shift register.

It will be obvious that the invention is not restricted to the embodiments described but that many variations are possible to those skilled in the art without departing from the scope of this invention.

For example, instead of an n-type semiconductor layer, a n-type semiconductor layer may be used in which majority charge carriers in the form of holes are transported through the semiconductor layer as information-forming charge. Furthermore the semiconductor layer may consist of other semiconductor materials, for example germanium or AIII-BV compounds, instead of silicon.

Furthermore, it is possible that the insulating layer which separates the electrodes from the semiconductor material consists of materials other than silicon oxide, for example, silicon nitride or aluminium oxide or of combinations of layers of different insulating materials provided one on the other.

Furthermore, for example, in the described first embodiment the electric fields present during operation in the semiconductor layer 2 and hence also the capacitive coupling between the information-forming electrons and the electrodes can be controlled by means of the potential of the substrate 9.

In the case in which the semiconductor layer is provided with electrodes on two oppositely located sides, a semiconductor layer may furthermore advantageously be used in the form of an epitaxial layer of one conductivity type which is provided on a substrate of the same conductivity type, the electrodes on at least one of the sides being formed by buried zones of the opposite conductivity type which are provided at the interface between the substrate and the epitaxial layer.

By setting up, for example, a sufficiently high reverse voltage at the substrate relative to the electrodes, it can be prevented by means of the formed depletion layer between the substrate and the epitaxial layer. If desirable, the buried zones can be connected to the surface an be contacted there in a usual manner outside the active part of the semiconductor layer by means of, for example, a diffused zone.

Furthermore, the charge carriers may also be introduced into the semiconductor layer by generation of charge carriers as a result of radiation, in which the holes forming minority charge carriers can be drained via the substrate (see, for example, FIG. 2) and the generated electrons remain in the semiconductor layer 2. Both for introducing and for reading information-carrying charge many other methods which are obvious to those skilled in the art and are also used in known shift registers may be used in addition to the systems described in the embodiments.

What is claimed is:

1. A charge coupled device comprising:
    (a) a semiconductor body having a semiconductor layer of one conductivity type adjoining a surface of said body at one side and forming a pn junction with a substrate portion of said body of the second conductivity type, said semiconductor layer having a thickness and doping concentration adapted to permit an electric field to be applied transversely to said layer with substantial freedom from avalanche multiplication and with a depletion zone being formed throughout the thickness of said semiconductor layer;
    (b) first means for locally introducing into said semiconductor layer at a first part thereof an electric charge embodying information;
    (c) second means for reading said charge at a second part of said layer;
    (d) third means for completely isolating at least during operation said semiconductor layer from any surroundings except at said first and second means, and at least during operation for laterally bounding said layer within said body;
    (e) fourth means being present at said one side of said semiconductor layer for receiving voltages and generating electric fields in said semiconductor layer for storing and transporting charges in said semiconductor layer from said first part to said second part of the semiconductor layer in a direction parallel to said layer, said fourth means comprising a plurality of electrode layer areas and respective barrier layer areas between said semiconductor layer and each of said electrode layer areas, said electrode layer areas and said barrier layer areas extending over at least the entire width of said semiconductor layer in a direction transverse to the direction of charge transport and parallel to the surface of said semiconductor layer; and
    (f) fifth means comprising clock voltage means connected to said electrode layer areas for applying respective clock voltages to said electrode layer areas thereby temporarily producing local depletion zones throughout the thickness of said semiconductor layer and which bound at least one of the regions of said semiconductor layer in which information is stored near the surface of the layer at a relatively small distance from said electrode layer areas, and said fifth means laterally transporting said information-forming charge through the bulk of said semiconductor layer by producing an electric field in said region whereby said charge is repelled from said region to a subsequent region mainly through the bulk of said semiconductor layer at a relatively large distance from the surface.

2. A semiconductor device comprising
a semiconductor layer insulated from surroundings at least during operation and being of such thickness to permit formation of depletion zones extending across the entire thickness of said layer without avalanche multiplication,
means for introducing majority charge carriers into said semiconductor layer at one surface of said semiconductor layer,
means at said surface for reading information from said majority charge carriers out of said semiconductor layer,
electrode means at said surface for moving said majority charge carriers through said semiconductor layer from said introduction means to said reading means,
said electrode means including a plurality of groups of electrodes, each of said groups being electrically interconnected for moving said majority charge carriers substantially laterally through the interior of said semiconductor layer by applying clock voltages to said respective groups, and
means for storing said majority charge carriers substantially near said surface of said semiconductor layer.

3. A semiconductor device as claimed in claim 2, wherein said electrodes comprise respective conductive layer electrodes and a barrier layer is disposed between said elecrodes and said semiconductor layer.

4. A semiconductor device as claimed in claim 3, wherein the width dimension of said electrodes and the pitch distances between two successive electrodes are at most substantially equal to the thickness of said semiconductor layer.

5. A semiconductor device as claimed in claim 3, wherein said electrodes are subdivided into at least three groups, respective said electrodes of said groups alternating in position and respective said electrodes of each of said groups being electrically interconnected by respective conductors.

6. A semiconductor device as claimed in claim 3, wherein said electrodes are provided at only one side of said semiconductor layer.

7. A semiconductor device as claimed in claim 6, wherein said semiconductor layer comprises a region of a first conductivity type which adjoins a surface of a semiconductor body and forms a pn junction with said semiconductor body of second conductivity type, said semiconductor layer comprising an island portion of said semiconductor body.

8. A semiconductor device as claimed in claim 7, wherein said island portion comprises upright wall portions and an insulaton zone is disposed adjacent said wall portions and at least partly comprises a layer of an insulating material which is inset in said semiconductor layer over at least a part of its thickness.

9. A semiconductor device as claimed in claim 7, further comprising a connection conductor electrically connecting said second conductivity type region to a voltage source, wherein during operation there is prevented accumulation of minority charge carriers in depletion zones formed in said semiconductor layer.

10. A semiconductor device as claimed in claim 3, wherein said reading means comprise a further electrode disposed behind the last one of said electrode means as viewed in the direction of charge transport, said further electrode being insulated from said semiconductor layer by a barrier layer and constituting the gate electrode of a first insulated gate field effect transistor, and wherein said semiconductor layer present between said gate electrode and said electrode means constitutes the source zone of said first transistor and said semiconductor layer beyond said gate electrode constitutes the drain zone of said first transistor, said drain zone being connected to a conductor which forms a drain conductor for information forming charge carriers.

11. A semiconductor device as claimed in claim 10, wherein said source zone of said transistor is electrically connected to the gate electrode of a second insulated gate field effect transistor, said second transistor being insulated from said semiconductor layer and comprising a source zone and a drain zone with a channel region therebetween, whereby the conductivity of said second transistor channel region forms a measure of the information-forming quantity of charge carriers transported through said semiconductor layer.

12. A semiconductor device as claimed in claim 11, wherein said source and drain zones of said first and second transistors and respective regions between said source and drain zones are of the same conductivity type as said semiconductor layer.

13. A semiconductor device as claimed in claim 2, wherein said members for applying clock voltages are connected to a voltage source, whereby there are temporarily produced local depletion zones which extend throughout the thickness of said semiconductor layer and which bound at least one of the regions of said semiconductor layer in which information is stored.

14. A semiconductor device as claimed in claim 13, wherein said semiconductor layer comprises a quantity of majority charge carriers belonging to the conductivity type of said semiconductor layer, said charge carriers comprising the information-forming charge.

15. A method of operating a semiconductor device including
(a) a semiconductor body having a semiconductor layer of one conductivity type, the thickness and the doping concentration of said semiconductor layer being adapted to permit an electric field to be applied transversely to said layer with substantial freedom from avalanche multiplication and with the formation of a depletion zone throughout the thickness of said semiconductor layer;
(b) first means for locally introducing at a first part of and into said semiconductor layer and electric charge embodying information;
(c) second means for reading said charge at a second part of said layer;
(d) third means for applying clock voltages to said layer, said third means comprising plural members disposed at at least one side of said semiconductor layer, said members in a direction transverse to the direction of charge transport and parallel to the surface of the layer extending over at least the entire width of the semiconductor layer, said charge being transported by said clock voltages throughout said semiconductor layer and in a direction parallel to said layer; and
(e) fourth means for completely isolating at least during operation said semiconductor layer from the surroundings thereof except at said first and second means;

wherein said members for applying the clock voltages are connected to a voltage source, whereby there are temporarily produced local depletion zones which extend throughout the thickness of said semiconductor layer and which bound at least one of the regions of said semiconductor layer in which information is stored, wherein said members comprise a row of electrodes which are separated from the semiconductor layer by a barrier layer, comprising the steps of applying voltages at a first instant to successive first, second, third, fourth and fifth ones of said electrodes, whereby depletion zones are present in the semiconductor layer opposite to the third and the fourth electrode, said zones extending transversely throughout the semiconductor layer with information-carrying charge in the form of charge carriers being present at least in the region opposite to the second electrode, and after a second instant reversing the polarity of the voltage difference between the first and the third electrodes and the voltage difference between the second and fourth electrodes, whereby said charge carriers are eliminated from the region opposite to the second electrode and flow at least partly, via the region opposite to the third electrode to the region opposite to the fourth electrode and the information-carrying charge is enclosed between a depletion zone formed opposite to the second electrode and a depletion zone present opposite to the fifth electrode, which zones both extend transversely through the semiconductor layer, the depletion layer formed opposite to the second electrode entirely occupying the region opposite to said electrode only at an instant at which the region opposite to the first electrode is substantially entirely free from charge carriers;

wherein said first electrode is connected to said second electrode via a direct voltage source and said third electrode is connected to said fourth electrode via a direct voltage source, whereby the resulting direct voltage difference between said first and second electrodes and between said third and fourth electrodes, respectively, ensures forming a depletion zone that is located in the region opposite said second and fourth electrodes, respectively, and that can occupy entirely the region present opposite to said electrode only when first a depletion zone is present opposite to the first and the third electrode, respectively, which extend transversely through the semiconductor layer.

* * * * *